(12) United States Patent
Lee et al.

(10) Patent No.: US 8,559,185 B2
(45) Date of Patent: Oct. 15, 2013

(54) INTEGRATED CIRCUIT PACKAGE SYSTEM WITH STACKABLE DEVICES AND A METHOD OF MANUFACTURE THEREOF

(75) Inventors: Sang-Ho Lee, Yeoju (KR); Soo-San Park, Seoul (KR); DaeSik Choi, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/477,630

(22) Filed: May 22, 2012

(65) Prior Publication Data

US 2012/0228767 A1    Sep. 13, 2012

Related U.S. Application Data

(63) Continuation of application No. 12/136,037, filed on Jun. 9, 2008, now Pat. No. 8,189,344.

(51) Int. Cl.
*H01L 23/02* (2006.01)
*H01L 21/00* (2006.01)
*H05K 1/16* (2006.01)

(52) U.S. Cl.
USPC ........... 361/790; 361/784; 174/255; 174/259; 174/261; 174/262; 174/263; 257/686; 438/107

(58) Field of Classification Search
None
See application file for complete search history.

(56) References Cited

U.S. PATENT DOCUMENTS

| | | | |
|---|---|---|---|
| 5,384,955 A * | 1/1995 | Booth et al. | 29/830 |
| 6,365,975 B1 | 4/2002 | DiStefano et al. | |
| 6,933,598 B2 * | 8/2005 | Karnezos | 257/686 |
| 7,053,477 B2 | 5/2006 | Karnezos et al. | |
| 7,148,576 B2 | 12/2006 | Nemoto | |
| 7,176,506 B2 | 2/2007 | Beroz et al. | |
| 7,271,496 B2 | 9/2007 | Kim | |
| 7,378,734 B2 | 5/2008 | Yabuki et al. | |
| 7,390,700 B2 | 6/2008 | Gerber et al. | |
| 7,435,619 B2 | 10/2008 | Shim et al. | |
| 7,659,608 B2 | 2/2010 | Cablao et al. | |
| 7,795,727 B2 | 9/2010 | Bauer et al. | |
| 8,089,143 B2 | 1/2012 | Lee | |
| 2008/0017968 A1 | 1/2008 | Choi et al. | |
| 2008/0105962 A1 | 5/2008 | Lee et al. | |

* cited by examiner

*Primary Examiner* — Boris Chervinsky
(74) *Attorney, Agent, or Firm* — Ishimaru & Associates LLP

(57) ABSTRACT

An integrated circuit package system includes: providing a package substrate; mounting an interposer chip containing active circuitry over the package substrate; attaching a conductive bump stack having a base bump end and a stud bump end, the base bump end on the interposer chip; connecting a stack connector to the interposer chip and the package substrate; and applying a package encapsulant over the interposer chip, the stack connector, and the conductive bump stack with the stud bump end of the conductive bump stack substantially exposed.

20 Claims, 4 Drawing Sheets

INTEGRATED CIRCUIT PACKAGE SYSTEM WITH STACKABLE DEVICES AND A METHOD OF MANUFACTURE THEREOF

CROSS-REFERENCE TO RELATED APPLICATION(S)

This application is a Continuation of co-pending U.S. patent application Ser. No. 12/136,037 filed Jun. 9, 2008, and the subject matter thereof is hereby incorporated herein by reference thereto.

TECHNICAL FIELD

The present invention relates generally to integrated circuit packages and more particularly to package on package (POP) integrated circuit package systems.

BACKGROUND ART

The integrated circuit package is the building block used in a high performance electronic system to provide applications for usage in products such as smart phones, pocket personal computers, intelligent portable military devices, aeronautical spacecraft payloads, and a vast line of other similar products that require small compact electronics supporting many complex functions.

The integrated circuit, such as a chip or die, contains circuitry that is designed to perform various functions in the high performance electronic system. Products having small dimensional requirements and many complex functions rely on limited size, limited quantity, and high connectivity integrated circuit package solutions.

The integrated circuit package can consists of a package base or package substrate providing a mounting structure on which at least one chip or die is attached and an enclosure such as an epoxy applied on it to protect its contents.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, or can be externally connected onto the single sealed package structure. Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. Also, the leverage and flexibility provided by replacing package components as needed contribute to market leadership.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention includes: providing a package substrate; mounting an interposer chip containing active circuitry such as transistors, which provide functionality, such as logic or memory functions, in the interposer chip, over the package substrate; attaching a conductive bump stack having a base bump end and a stud bump end, the base bump end on the interposer chip; connecting a stack connector to the interposer chip and the package substrate; and applying a package encapsulant over the interposer chip, the stack connector, and the conductive bump stack with the stud bump end of the conductive bump stack substantially exposed.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
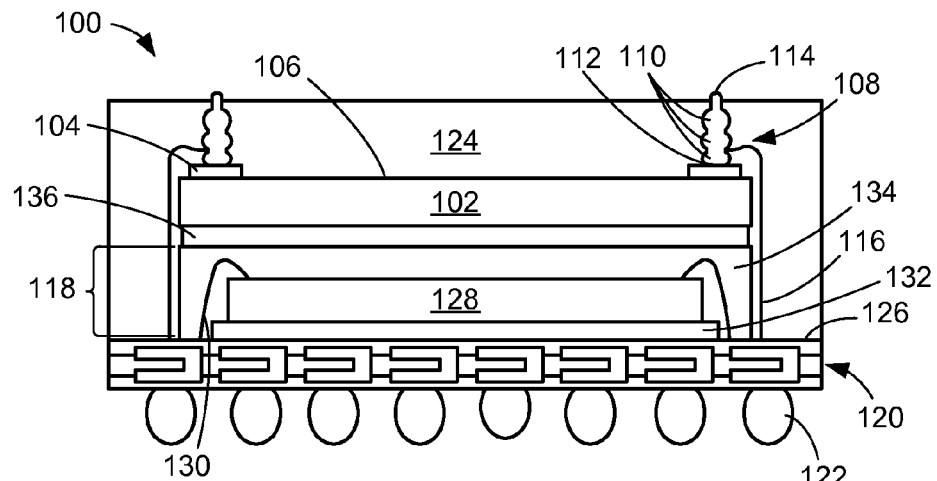
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
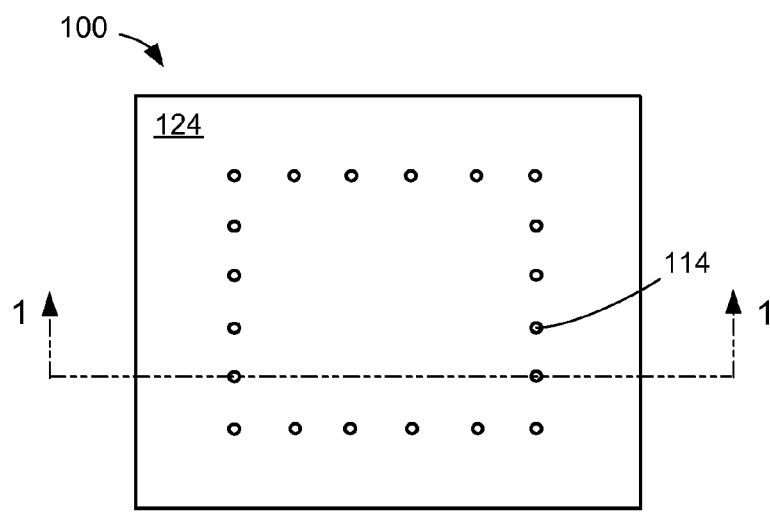
FIG. 2 is a top view of the integrated circuit package system in the first embodiment of the present invention.

Referring now to FIG. 1, therein is shown a cross-sectional view of an integrated circuit package system 100 taken along line 1-1 of FIG. 2 in a first embodiment of the present invention. The integrated circuit package system 100 can preferably include an interposer chip 102, chip bond pads 104 adjacent an active chip surface 106, and conductive bump stacks 108. The interposer chip 102 contains active circuitry, such as transistors, which provide functionality, such as logic or memory, in the interposer chip 102. The chip bond pads 104 provide connectivity to the circuitry of the interposer chip 102 and a spacing between the interposer chip 102 and each of the conductive bump stacks 108.

Conductive bond bumps 110, such as solder or wire bumps, are attached on one another to form structures referred to as the conductive bump stacks 108. The conductive bump stack 108 includes at least two conducive bond bumps 110 stacked or attached on one another. The conductive bump stacks 108 includes a base bump end 112 on one end and a stud bump end 114 on an opposite end of the conductive bump stacks 108. The base bump end 112 is located on the conductive bond bumps 110 of the conductive bump stacks 108 not attached onto another of the conductive bond bumps 110.

The stud bump end 114 is located on the conductive bond bumps 110 of the conductive bump stacks 108 having no other of the conductive bond bumps 110 attached onto it. The base bump end 112 of each of the conductive bump stacks 108 can connect on to the chip bond pads 104 resulting in the stud bump end 114 of the conductive bump stacks 108 positioned over the chip bond pads 104.

The integrated circuit package system 100 also can preferably include stack connectors 116, such as bond wires, an integrated circuit module 118, a package substrate 120, package connectors 122, such as solder balls, and a package encapsulant 124. The integrated circuit module 118 can be mounted over a component side 126 of the package substrate 120. The length or width of the integrated circuit module 118 is smaller than the corresponding length or width of the package substrate 120.

The integrated circuit module 118 can include a module chip 128. The circuitry of the module chip 128 can connect to the component side 126 of the package substrate 120 using internal device connectors 130, such as bond wires. A base attachment layer 132 can be used to attach the module chip 128 to the component side 126.

The package connectors 122, attached to the side opposite the component side 126 of the package substrate 120, can provide connectivity to a next level system such as a printed circuit board. The integrated circuit module 118 can be protected using a base encapsulant 134 applied over the module chip 128, the internal device connectors 130, and portions of the component side 126 adjacent to the internal device connectors 130.

The interposer chip 102 can mount above the component side 126 of the package substrate 120 using a chip attachment layer 136. The stack connectors 116 can attach the conductive bump stacks 108 to the component side 126 providing connectivity to the package substrate 120. The package encapsulant 124 can be applied over the interposer chip 102, the stack connectors 116, the component side 126 of the package substrate, and the conductive bump stacks 108 excluding the stud bump end 114.

The stud bump end 114, substantially exposed adjacent the package encapsulant 124, can provide connectivity to circuitry of the interposer chip 102, circuitry of the integrated circuit module 118, and circuitry of a next level system. The stud bump end 114 can provide connectivity for external component circuitry such as another package, multiple modules, electronic sensors, or other user specific device components.

The integrated circuit package system 100 provides substantial improvements in connectivity, signal routing, and functional scalability for electronic products. A significant reduction in both component height and costs of the integrated circuit package system 100 can be attributed to the interposer chip 102 providing both interposer functionality and reduced manufacturing processing.

It is noted that the integrated circuit module 118 is non-restrictive in content and for example could consists of multiple die stacks, multiple packages, flip chip, or any circuitry contained with a defined package.

It has been unexpectedly discovered that the stud bump end 114 can be implemented to provide significant improvements in shipped product quality, customer field support, and all the benefits of interposer connectivity. The stud bump end 114 can provide connectivity for enhanced manufacturing testing and can be used to access memory resident within the integrated circuit package system 100 to provide customer site firmware upgrade or customization capabilities.

Referring now to FIG. 2, therein is shown a top view of the integrated circuit package system 100 in the first embodiment of the present invention. The stud bump end 114 is shown as individually circular exposed areas distributed adjacent to each side edge of the package encapsulant 124 of the integrated circuit package system 100 forming a rectangular placed connecting pattern.

The stud bump end 114 placement and quantities can optionally be configured to support numerous device and component connectivity geometries such as a circular pattern, a triangular pattern, or other pattern combinations including random placements.

Figure 3:
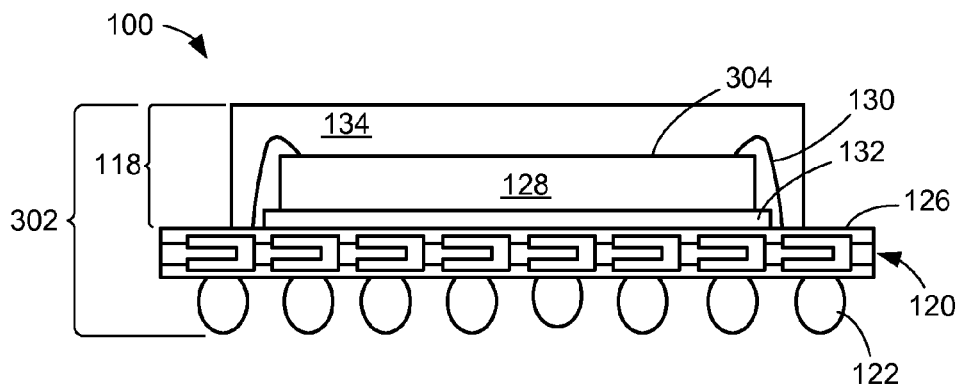
FIG. 3 is the structure of FIG. 2 in a base encapsulation phase.

Referring now to FIG. 3, therein is shown the structure of FIG. 2 in a base encapsulation phase. A base package 302 can preferably include the integrated circuit module 118, the package substrate 120, and the package connectors 122. The integrated circuit module 118 includes the module chip 128 with an active bonding side 304 used to provide connectivity to the component side 126 of the package substrate 120 using the internal device connectors 130.

The side opposite the active bonding side 304 attaches the module chip 128 to the component side 126 using the base attachment layer 132. The base encapsulant 134 is applied over the active bonding side 304, the internal device connectors 130, and surrounding the module chip 128. Portions of the component side 126 adjacent the internal device connectors 130 are free of the base encapsulant 134 and can be used for further connectivity.

The package substrate 120 provides connectivity between the component side 126 and the side opposite the component side 126. The package connectors 122 are attached to the side opposite the component side 126 providing connectivity of the package substrate 120 to a next level system such as a printed circuit board.

Figure 4:
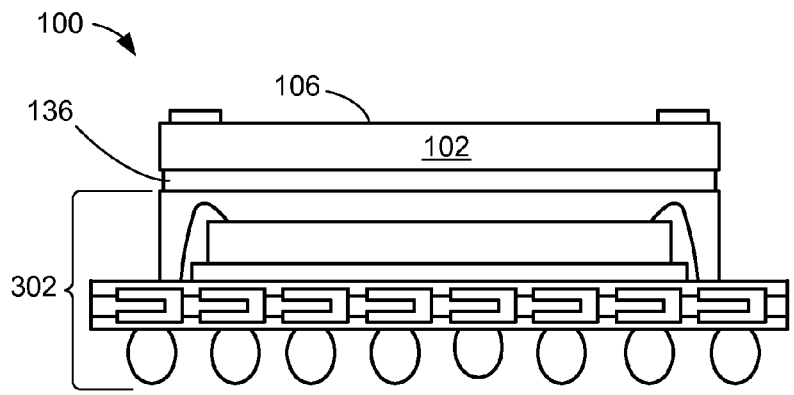
FIG. 4 is the structure of FIG. 3 in a chip interposer mounting phase.

Referring now to FIG. 4, therein is shown the structure of FIG. 3 in a chip interposer mounting phase. Shown are the base package 302, the module chip 128 of FIG. 1, the active chip surface 106 of the interposer chip 102, and the chip attachment layer 136. The side opposite the active chip surface 106 can be attached over the base package 302 using the chip attachment layer 136.

Figure 5:
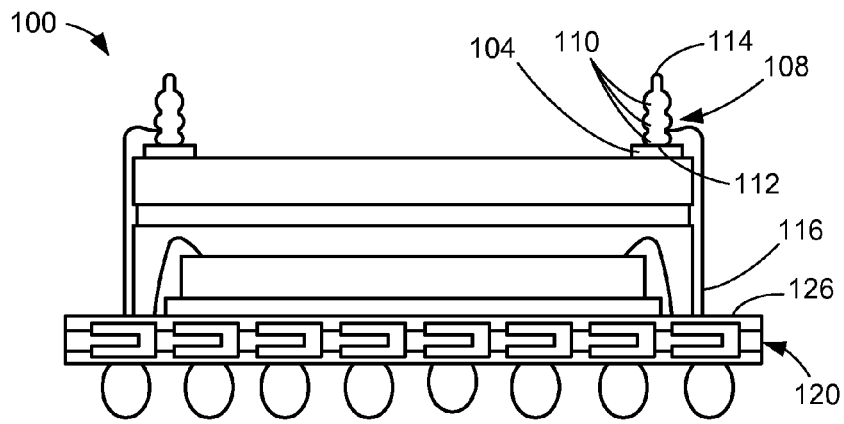
FIG. 5 is the structure of FIG. 4 a bump and connect phase.

Referring now to FIG. 5, therein is shown the structure of FIG. 4 a bump and connect phase. The conductive bond bumps 110 are attached on to the chip bond pads 104 forming the base bump end 112. Each of the conductive bond bumps 110 attached to the chip bond pads 104 have two more conductive bond bumps 110 stacked on one another and on to the conductive bond bumps 110 having the base bump end 112.

The last of the conductive bond bumps 110 attached on to another of the conductive bond bumps 110 and over the chip bond pads 104 forms the stud bump end 114 of the conductive bump stacks 108. The quantity of the conductive bond bumps 110 between the conductive bond bumps 110 forming the base bump end 112 and the conductive bond bumps 110 forming the stud bump end 114 can be optionally adjusted to form pre-determined heights for each of the conductive bump stacks 108.

The stud bump end 114 of each of the conductive bump stacks 108 can be optionally formed to any pre-determined physical geometry required of the integrated circuit package system 100 application. The stack connectors 116 can connect each of the conductive bump stacks 108 with the component side 126 of the package substrate 120. It is noted that the stack connectors 116 can be attached to any of the conductive bond bumps 110 associated with any one of the conductive bump stacks 108.

Figure 6:
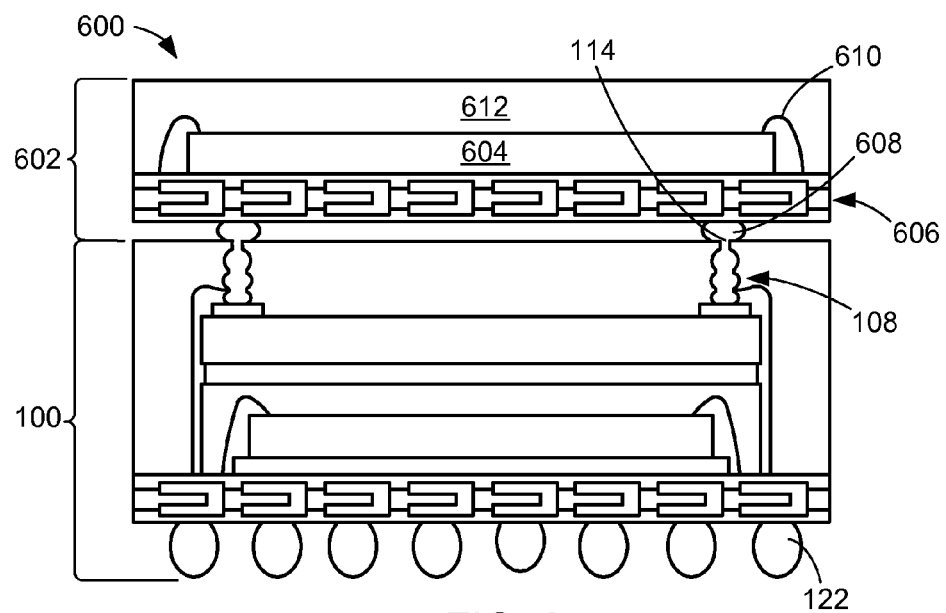
FIG. 6 is a cross-sectional view similar to FIG. 1 of an integrated circuit package system in a second embodiment of the present invention.

Referring now to FIG. 6, therein is shown a cross-sectional view similar to FIG. 1 of an integrated circuit package system 600 in a second embodiment of the present invention. The integrated circuit package system 600 can preferably include an external device 602 and the integrated circuit package system 100. The external device 602 can include a die 604, an interposer substrate 606, external connectors 608, bond wires 610, and a device encapsulant 612.

The external connectors 608 are attached to a side of the interposer substrate 606. The die 604 is mounted over the interposer substrate 606, on a side opposite the side having the external connectors 608. The bond wires 610 provide connectivity between the circuitry of the die 604 and the interposer substrate 606. The device encapsulant 612 is applied over the die 604, the bond wires 610, and the interposer substrate 606.

Each of the external connectors 608 can attach to the stud bump end 114 of the conductive bump stacks 108 to provide connectivity between circuitry of the external device 602, the integrated circuit package system 100, and a next level system connecting to the package connectors 122.

It is noted that the external device 602 can for example consists of a package on package device, package in package device, multiple devices, or any component capable of connecting to the stud bump end 114.

Figure 7:
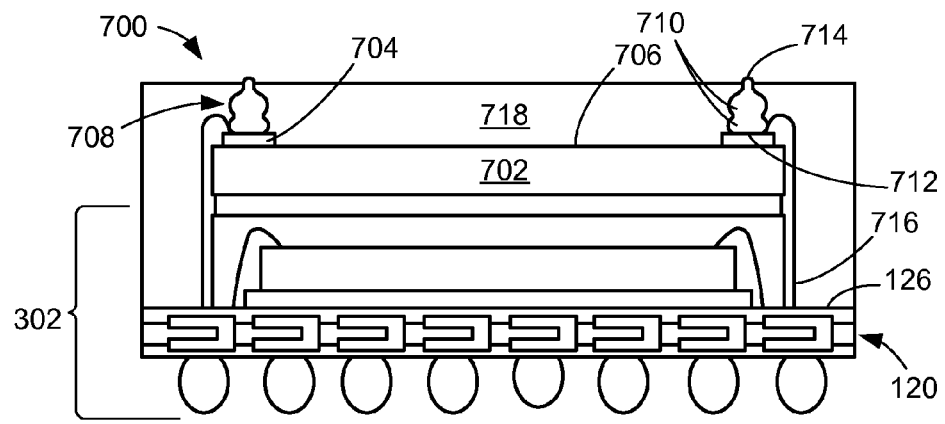
FIG. 7 is a cross-sectional view similar to FIG. 1 of an integrated circuit package system in a third embodiment of the present invention.

Referring now to FIG. 7, therein is shown a cross-sectional view similar to FIG. 1 of an integrated circuit package system 700 in a third embodiment of the present invention. The integrated circuit package system 700 can preferably include an interposer chip 702 mounted over the base package 302, chip bond pads 704 adjacent an active chip surface 706, and conductive bump stacks 708. The interposer chip 702 contains active circuitry, such as transistors, which provide functionality, such as logic or memory, in the interposer chip 702. The chip bond pads 704 provide connectivity to the circuitry of the interposer chip 702.

Conductive bond bumps 710, such as solder or wire bumps, are attached on one another to form the structure of the conductive bump stacks 708. The conductive bump stack 708 includes at least two conducive bond bumps 710 stacked or attached on one another. The conductive bump stacks 708 includes a base bump end 712 on one end and a stud bump end 714 on an opposite end of the conductive bump stacks 708. The base bump end 712 is located on the conductive bond bumps 710 of the conductive bump stacks 708 not attached onto another of the conductive bond bumps 710.

The stud bump end 714 is located on the conductive bond bumps 710 of the conductive bump stacks 708 having no other of the conductive bond bumps 710 attached onto it. The base bump end 712 of each of the conductive bump stacks 708 can connect on to the chip bond pads 704 resulting in the stud bump end 714 of the conductive bump stacks 708 positioned over the chip bond pads 704.

The number of layers of the conductive bond bumps 710 can be changed as required for specific user applications. Stack connectors 716, such as bond wires, can attach the component side 126 of the package substrate 120 with the chip bond pads 704 adjacent the conductive bump stacks 708 to provide connectivity between circuitry of the interposer chip 702 and the base package 302.

A package encapsulant 718 can be applied over the interposer chip 702, the stack connectors 716, the base package 302, and the conductive bump stacks 708 excluding the stud bump end 714 of each of the conductive bump stacks 708. The stud bump end 714 is substantially exposed adjacent the package encapsulant 718. The resulting integrated circuit package system 700 provides a low profile component available for further processing into a next level system application.

Figure 8:
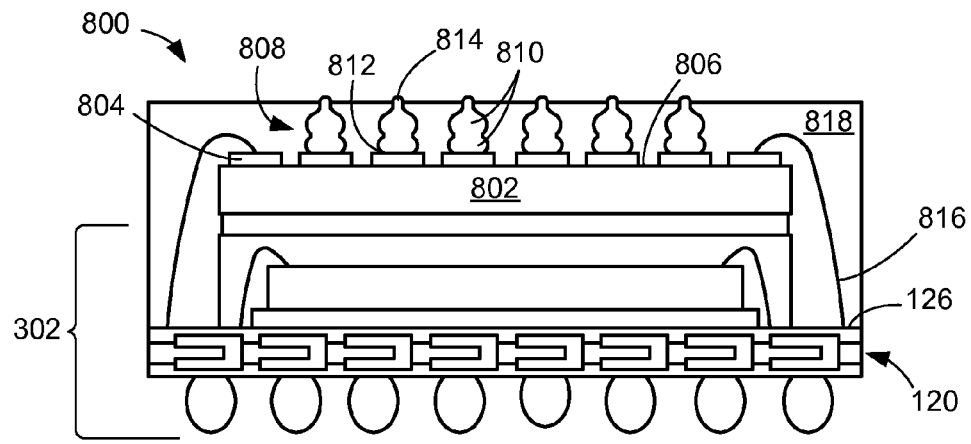
FIG. 8 is a cross-sectional view of an integrated circuit package system taken along line 8-8 of FIG. 9 in a fourth embodiment of the present invention.
Figure 9:
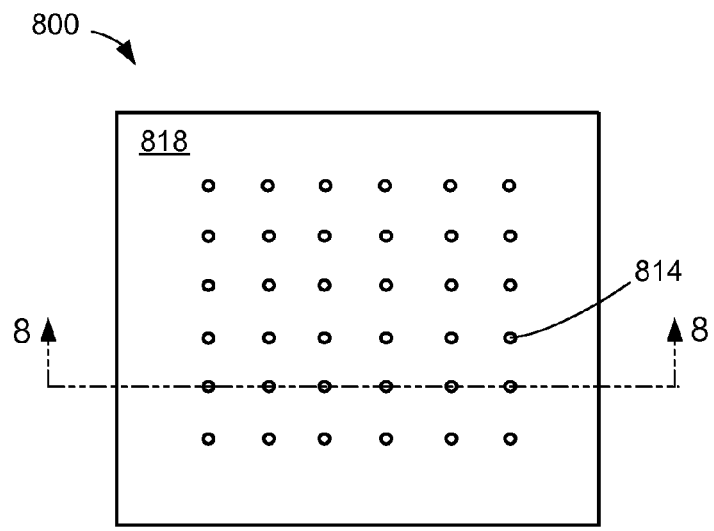
FIG. 9 is a top view of the integrated circuit package system in the fourth embodiment of the present invention.

Referring now to FIG. 8, therein is shown a cross-sectional view of an integrated circuit package system 800 taken along line 8-8 of FIG. 9 in a fourth embodiment of the present invention. The integrated circuit package system 800 can preferably include an interposer chip 802 mounted over the base package 302, chip bond pads 804 adjacent an active chip surface 806, and conductive bump stacks 808. The interposer chip 802 contains active circuitry, such as transistors, which provide functionality, such as logic or memory, in the interposer chip 802. The chip bond pads 804 provide connectivity to the circuitry of the interposer chip 802.

Conductive bond bumps 810, such as solder or wire bumps, are attached on one another to form the structure of the conductive bump stacks 808. The conductive bump stack 808 includes at least two conducive bond bumps 810 stacked or attached on one another. The conductive bump stacks 808 includes a base bump end 812 on one end and a stud bump end 814 on an opposite end of the conductive bump stacks 808. The base bump end 812 is located on the conductive bond bumps 810 of the conductive bump stacks 808 not attached onto another of the conductive bond bumps 810.

The stud bump end 814 is located on the conductive bond bumps 810 of the conductive bump stacks 808 having no other of the conductive bond bumps 810 attached onto it. The base bump end 812 of each of the conductive bump stacks 808 can connect on to the chip bond pads 804 resulting in the stud bump end 814 of the conductive bump stacks 808 positioned over the chip bond pads 804.

The number of layers of the conductive bond bumps 810 can be changed as required for specific user applications. Any of the chip bond pads 804 not having attachments to any of the conductive bump stacks 808 can provide connectivity between circuitry of the interposer chip 802 and the component side 126 of the package substrate 120 using the stack connectors 816. A package encapsulant 818 can be applied over the interposer chip 802, the stack connectors 816, the base package 302, and the conductive bump stacks 808 excluding the stud bump end 814.

The stud bump end 814, substantially exposed adjacent the package encapsulant 818, can provide connectivity to circuitry of the interposer chip 802. The integrated circuit package system 800 can provide direct connectivity between the circuitry of the interposer chip 802 and the stud bump end 814 and connectivity isolation from the component side 126 of the base package 302.

Referring now to FIG. 9, therein is shown a top view of the integrated circuit package system 800 in the fourth embodiment of the present invention. The stud bump end 814 is shown as individually circular exposed areas distributed adjacent to the package encapsulant 818 of the integrated circuit package system 800 forming a rectangular placed connecting grid pattern.

The stud bump end 814 placement and quantities can optionally be configured to support numerous device and component connectivity geometries such as a circular pattern, a triangular pattern, or other pattern combinations including random placements.

Figure 10:
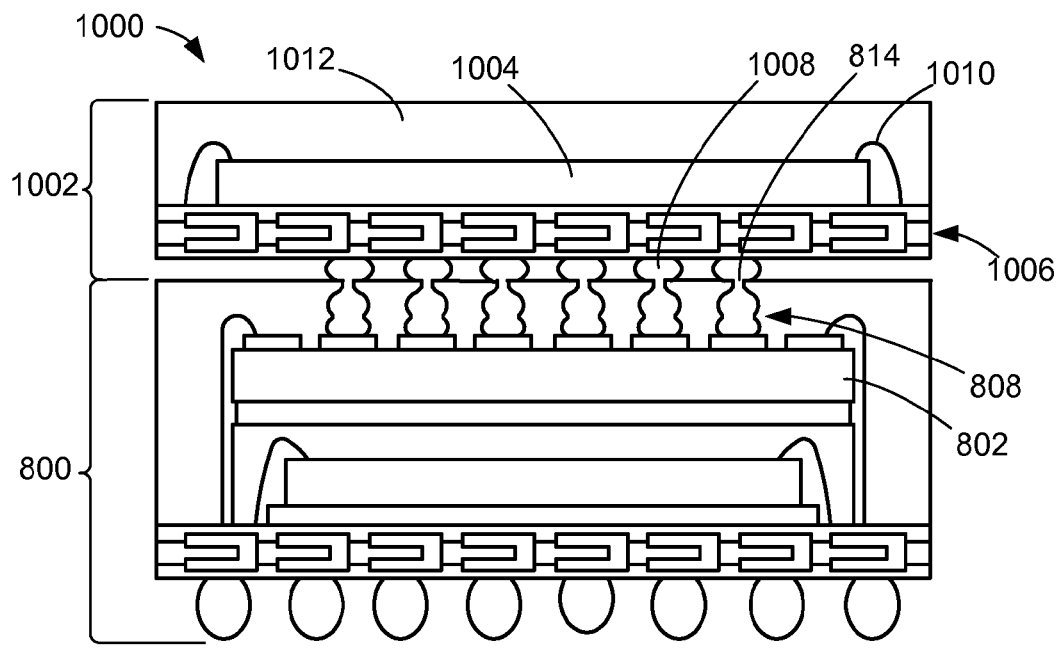
FIG. 10 is a cross-sectional view similar to FIG. 8 of an integrated circuit package system in a fifth embodiment of the present invention.

Referring now to FIG. 10, therein is shown a cross-sectional view similar to FIG. 8 of an integrated circuit package system 1000 in a fifth embodiment of the present invention. The integrated circuit package system 1000 can preferably include an external device 1002 and the integrated circuit package system 800. The external device 1002 can include a die 1004, an interposer substrate 1006, external connectors 1008, bond wires 1010, and a device encapsulant 1012.

The external connectors 1008 attach to the interposer substrate 1006. The die 1004 is mounted over the interposer substrate 1006, on a side opposite the side having the external connectors 1008. The bond wires 1010 provide connectivity between the circuitry of the die 1004 and the interposer substrate 1006. The device encapsulant 1012 is applied over the die 1004, the bond wires 1010, and the interposer substrate 1006.

Each of the external connectors 1008 can attach to a stud bump end 814 to provide connectivity between circuitry of the external device 1002 and the interposer chip 802 of the integrated circuit package system 800. It is noted that the external device 1002 can for example consists of a package on package device, package in package device, multiple devices, or any component capable of connecting to the stud bump end 814 of the conductive bump stacks 808.

Figure 11:
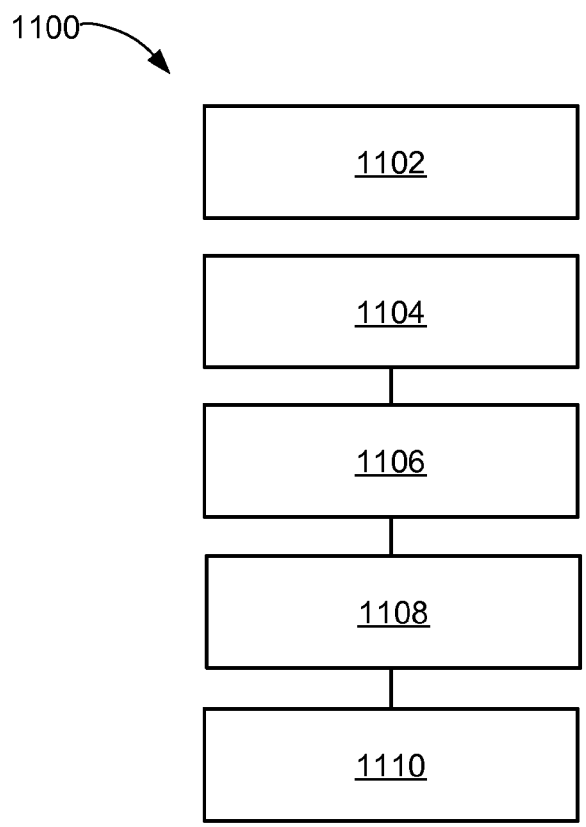
FIG. 11 therein is shown a flow chart of an integrated circuit package system for manufacturing the integrated circuit package system in an embodiment of the present invention.

Referring now to FIG. 11, therein is shown a flow chart of an integrated circuit package system 1100 for manufacturing the integrated circuit package system 100 of FIG. 1 in an embodiment of the present invention. The system 1100 includes providing a package substrate in a block 1102; mounting an interposer chip containing active circuitry such as transistors, which provide functionality, such as logic or memory functions, in the interposer chip, over the package substrate in a block 1104; attaching a conductive bump stack having a base bump end and a stud bump end, the base bump end on the interposer chip in a block 1106; connecting a stack connector to the interposer chip and the package substrate in a block 1108; and applying a package encapsulant over the interposer chip, the stack connector, and the conductive bump stack with the stud bump end of the conductive bump stack substantially exposed in a block 1110.

In greater detail, a system to provide the method and apparatus of the integrated circuit package system 100, in an embodiment of the present invention, is performed as follows:

1. Providing a package substrate having a component side;
2. Mounting an interposer chip containing active circuitry and having a chip bond pad adjacent an active chip surface over the package substrate;
3. Attaching a conductive bump stack having base bump end and a stud bump end, the base bump end on the interposer chip;
4. Connecting a stack connector to the interposer chip and the component side of the package substrate; and
5. Applying a package encapsulant over the interposer chip, the stack connector, and the conductive bump stack providing the stud bump end substantially exposed adjacent the package encapsulant.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:
1. A method for manufacturing an integrated circuit package system comprising:
   providing a package substrate;

mounting an interposer chip containing active circuitry over the package substrate;

attaching a conductive bump stack, including at least two conductive bond bumps, having a base bump end and a stud bump end, the base bump end on the interposer chip;

connecting a stack connector to the interposer chip and the package substrate; and applying a package encapsulant over the interposer chip, the stack connector, and the conductive bump stack with the stud bump end of the conductive bump stack substantially exposed.

2. The method as claimed in claim 1 further comprising providing an integrated circuit module having the interposer chip thereover.

3. The method as claimed in claim 1 wherein connecting the stack connector includes connecting the stack connector to the package substrate and the interposer chip having a spacing from any of the conductive bump stack.

4. The method as claimed in claim 1 wherein connecting the stack connector includes connecting the stack connector to the conductive bump stack and the package substrate.

5. The method as claimed in claim 1 further comprising connecting an external device on the stud bump end.

6. A method for manufacturing an integrated circuit package system comprising:

providing a package substrate having a component side;

mounting an interposer chip containing active circuitry and having a chip bond pad adjacent an active chip surface over the package substrate;

attaching a conductive bump stack, including at least two conductive bond bumps, having a base bump end and a stud bump end, the base bump end on the interposer chip;

connecting a stack connector to the interposer chip and the component side of the package substrate; and applying a package encapsulant over the interposer chip, the stack connector, and the conductive bump stack providing the stud bump end substantially exposed adjacent the package encapsulant.

7. The method as claimed in claim 6 further comprising providing an integrated circuit module on the package substrate having the interposer chip thereover.

8. The method as claimed in claim 6 wherein connecting the stack connector includes connecting the stack connector to the package substrate and the chip bond pad without the conductive bump stack.

9. The method as claimed in claim 6 wherein connecting the stack connector includes connecting the stack connector to the package substrate and the chip bond pad with the conductive bump stack.

10. The method as claimed in claim 6 further comprising connecting an external device having external connectors on the stud bump end of the conductive bump stack.

11. An integrated circuit package system comprising:
a package substrate;
an interposer chip containing active circuitry mounted over the package substrate;
a conductive bump stack, including at least two conductive bond bumps, having a base bump end and a stud bump end, the base bump end on the interposer chip;
a stack connector connected to the interposer chip and the package substrate; and
a package encapsulant over the interposer chip, the stack connector, and the conductive bump stack with the stud bump end of the conductive bump stack substantially exposed.

12. The system as claimed in claim 11 further comprising an integrated circuit module having the interposer chip thereover.

13. The system as claimed in claim 11 wherein the stack connector is connected to the package substrate and the interposer chip having a spacing from any of the conductive bump stack.

14. The system as claimed in claim 11 wherein the stack connector is connected to the conductive bump stack and the package substrate.

15. The system as claimed in claim 11 further comprising an external device connected on the stud bump end.

16. The system as claimed in claim 11 wherein:
the interposer chip containing active circuitry has a chip bond pad adjacent an active chip surface;
the conductive bump stack having the base bump end and the stud bump end, the base bump end on the interposer chip;
the stack connector is connected to the interposer chip and a component side of the package substrate; and
the package encapsulant is over the interposer chip, the stack connector, and the conductive bump stack providing the stud bump end substantially exposed adjacent the package encapsulant.

17. The system as claimed in claim 16 further comprising an integrated circuit module on the package substrate having the interposer chip thereover.

18. The system as claimed in claim 16 wherein the stack connector is connected to the package substrate and the chip bond pad without the conductive bump stack.

19. The system as claimed in claim 16 wherein the stack connector is connected to the chip bond pad adjacent the conductive bump stack and the package substrate.

20. The system as claimed in claim 16 further comprising an external device having an external connector connected on the stud bump end of the conductive bump stack.

* * * * *